(12) United States Patent
Sugimoto

(10) Patent No.: US 8,497,462 B2
(45) Date of Patent: Jul. 30, 2013

(54) TRANS-IMPEDANCE AMPLIFIER WITH VARIABLE BANDWIDTH AND DIGITAL COHERENT OPTICAL RECEIVER INSTALLING THE SAME

(75) Inventor: Yoshiyuki Sugimoto, Yokohama (JP)

(73) Assignee: Sumitomo Electric Industries, Ltd., Osaka-Shi (JP)

( * ) Notice: Subject to any disclaimer, the term of this patent is extended or adjusted under 35 U.S.C. 154(b) by 309 days.

(21) Appl. No.: 13/111,317

(22) Filed: May 19, 2011

(65) Prior Publication Data

US 2011/0293293 A1 Dec. 1, 2011

(30) Foreign Application Priority Data

May 26, 2010 (JP) .................. 2010-120988

(51) Int. Cl.
*H04B 10/06* (2006.01)
*H03F 3/04* (2006.01)

(52) U.S. Cl.
USPC ........... 250/214 A; 330/86; 330/110; 330/278

(58) Field of Classification Search
USPC .................. 250/214 A; 330/86, 278, 308
See application file for complete search history.

(56) References Cited

U.S. PATENT DOCUMENTS

| 4,882,482 | A  | * | 11/1989 | Smith et al. ............... 250/214 A |
| 6,788,152 | B2 | * | 9/2004  | Nishizono ..................... 330/308 |
| 7,015,758 | B2 | * | 3/2006  | Morohashi et al. ........... 330/278 |
| 7,358,818 | B2 |   | 4/2008  | Uesaka et al. |

* cited by examiner

*Primary Examiner* — Tony Ko
(74) *Attorney, Agent, or Firm* — Venable LLP; Michael A. Sartori

(57) ABSTRACT

A trans-impedance amplifier (TIA) with an adjustable bandwidth is disclosed. The TIA of the present invention includes the amplifying stage and the emitter follower stage arranged in the downstream of the amplifying stage. The transistor in the amplifying stage includes a diode in the emitter thereof to provide a substantial emitter level to the transistor. This diode is biased by another current source with a variable function. The operating point of the diode, in particular, the differential resistance thereof, is variable by the current source, which adjusts the bandwidth of the TIA without affecting the phase characteristic of the TIA.

9 Claims, 4 Drawing Sheets

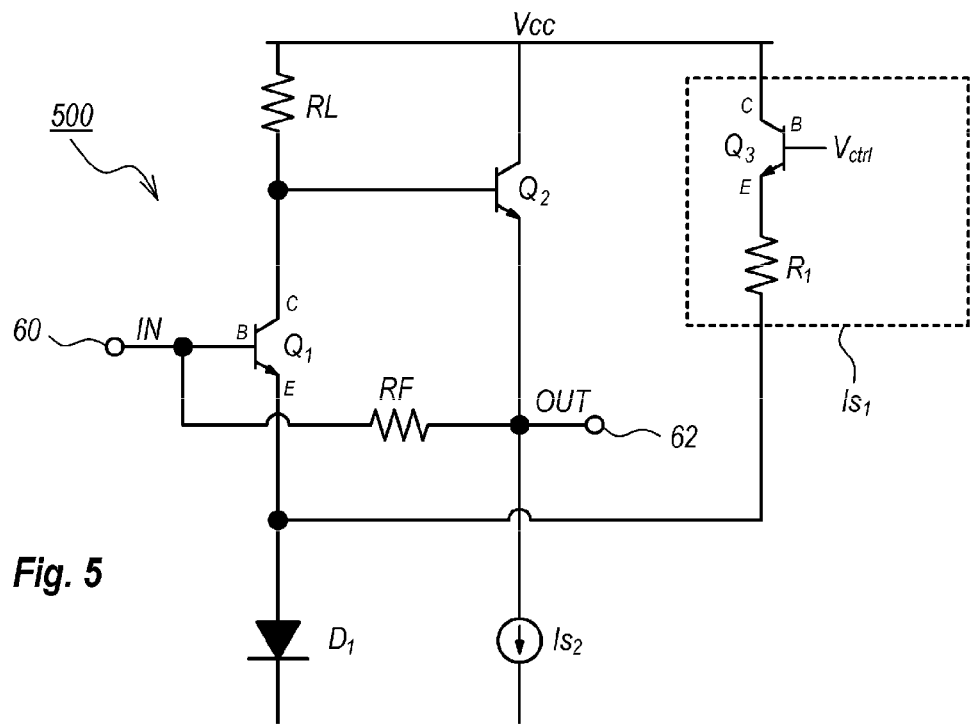
Fig. 5
Fig. 6
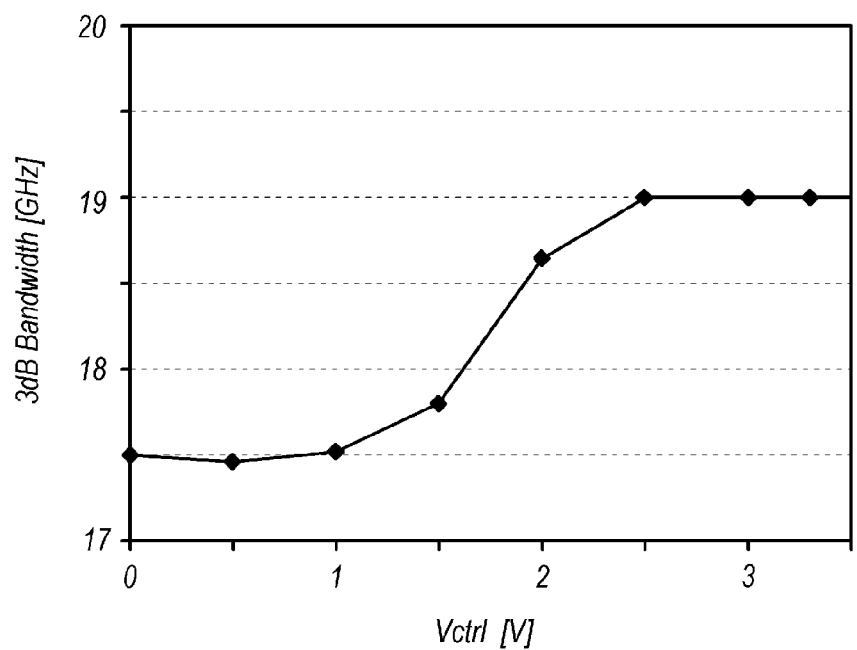

US 8,497,462 B2

TRANS-IMPEDANCE AMPLIFIER WITH VARIABLE BANDWIDTH AND DIGITAL COHERENT OPTICAL RECEIVER INSTALLING THE SAME

BACKGROUND OF THE INVENTION

1. Field of the Invention

The present invention relates to a trans-impedance amplifier (hereafter denoted as TIA), in particular, the invention relates to the TIA with the function of the variable bandwidth and a digital coherent receiver installing the TIA.

2. Related Prior Art

A TIA used in an optical receiver may convert a photocurrent generated by a light-receiving device, for instance, a photodiode (hereafter denoted as PD) into a voltage signal, and sometimes amplifies thus converted voltage signal. A future system featured by the digital coherent technology may install a plurality of TIAs. U.S. Pat. No. 7,358,818, has disclosed a pre-amplifier of the type of the TIA. The resistance/impedance of the trans-impedance, or the open loop gain of the amplifier of the TIA disclosed therein may adjust the bandwidth of the TIA.

In an arrangement where the trans-impedance is so adjusted to equalize the bandwidth of the TIAs in the coherent receiver, the trans-impedance may also vary other factors of the TIA such as the phase-gain tolerance thereof, which may degrade the signal quality output from the TIA. The digital coherent receiver applied to the system using the phase shift keying (PSK) modulates the phase of the input signal; accordingly, the phase characteristic of the TIA is preferable to be independent of the bandwidth thereof.

SUMMARY OF THE INVENTION

An aspect of the present invention relates to a TIA that includes an input to receive an input current and an output to output an output voltage corresponding to the input current. The TIA of the invention may include an amplifying stage, an emitter follower stage, and a trans-impedance. The amplifying stage includes a load resistor, a first transistor and a diode, where they are connected in series in this order between the power supply Vcc and the ground. The first transistor is coupled in the control electrode thereof with the input of the TIA. The emitter follower stage includes a second transistor and a current source, where they are also connected in series in this order between the power supply Vcc and the ground. The second transistor receives in the control electrode thereof an output of the amplifying stage, and one of current electrodes thereof, which is connected to the current source, couples with the output of the TIA. The trans-impedance is connected between the input and the output of the TIA.

The TIA of the present invention may further include a variable current source that provides a variable bias current to the diode connected to the first transistor. The variable bias current to the diode may vary the operating point of the diode, which also varies the differential resistance of the diode, to change the bandwidth of the TIA without substantially varying other parameters, in particular, the phase characteristic of the TIA.

Another aspect of the present invention relates to an optical receiver, in particular, an optical receiver applicable to the digital coherent communication. The optical receiver of the invention may include a plurality of O/E converters each having a pair of photodiodes and a TIA; and a controller. The TIA in respective O/E converters includes an input terminal, an output terminal, a first transistor, a diode, a second transistor, a current source, a variable current source, and a trans-impedance. The base of the first transistor is connected to the input terminal; while, the emitter thereof is connected to the diode. The base of the second transistor is connected to the collector of the first transistor; while, the emitter thereof is connected to the output terminal of the TIA and the current source. The trans-impedance is put between the input terminal and the output terminal.

A feature of the optical receiver of the present invention is that the TIA in respective O/E converters may further provide a variable current source to provide a variable bias current to the diode; and the controller may control the variable bias current in respective O/E converters independently.

BRIEF DESCRIPTION OF THE DRAWINGS

The foregoing and other purposes, aspects and advantages will be better understood from the following detailed description of a preferred embodiment of the invention with reference to the drawings, in which:

FIG. 5 is a circuit diagram of another TIA according to the second embodiment of the present invention;

FIG. 6 shows a behavior of the 3 dB bandwidth of the TIA against the base control level Vctrl of the TIA with the variable bandwidth shown in FIG. 5.

DETAILED DESCRIPTION OF PREFERRED EMBODIMENTS

Figure 1:
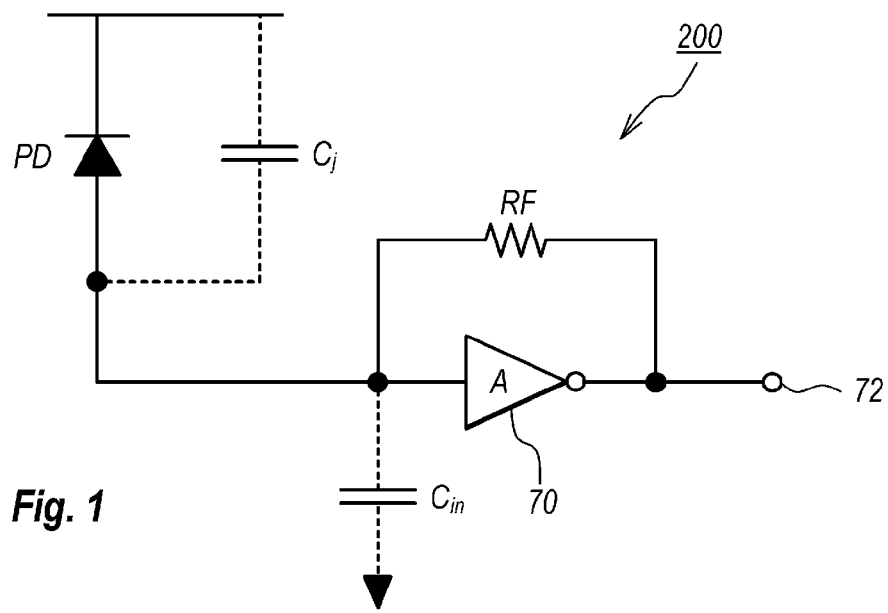
FIG. 1 shows a block diagram of an example of a conventional O/E-C.

First, the gain and bandwidth of the TIA will be described as referring to FIG. 1. FIG. 1 is an exemplary circuit diagram of the optical-to-electrical conversion circuit. As shown in FIG. 1, the circuit 200 includes a photodiode PD, an inverting amplifier 70 having an open loop gain of A, a feedback resistor RF, which is often called as a trans-impedance, and an output terminal 72. The inverting amplifier 70 and the feedback resistor RF constitute the TIA. The conversion circuit 200 converts a faint photocurrent generated by the PD into a voltage signal and outputs thus converted voltage signal from the output terminal 72. Assuming a sum of the input capacitance Cin of the TIA and the junction capacitance $C_j$ of the PD is $C_t$, resistance of the feedback resistor is $R_f$, and the bandwidth of the circuit 200 is BW, the bandwidth BW is given by:

$$BW = (A+1)/(2\pi R_f C_t). \quad (1)$$

Thus, the bandwidth of the circuit 200 depends on the gain A of the inverting amplifier.

Figure 2:
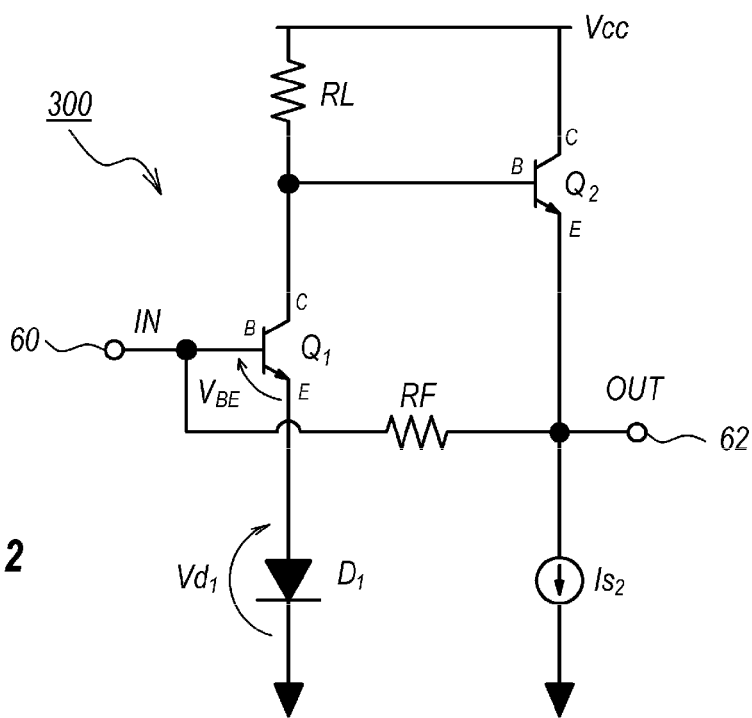
FIG. 2 shows a circuit diagram of an example of a conventional TIA implemented with the optical receiver 200 shown in FIG. 1.

One of conventional TIAs will be described as referring to FIG. 2 that is a circuit diagram of the conventional TIA 300. The TIA 300 includes an amplifying stage, an emitter follower stage, a feedback resistor RF, an input terminal and an output terminal. The amplifying stage includes the first transistor $Q_1$, a load resistor RL and a diode D1, where these components are connected in series between the power supply Vcc and the ground to constituted the emitter grounded amplifier. The emitter follower stage includes the second transistor $Q_2$ and a current source $I_{S2}$. The first transistor $Q_1$ is coupled with the input terminal 60 in the base thereof, the base of the second transistor $Q_2$ in the collector thereof, and the anode of the diode $D_1$ in the emitter thereof. The cathode of the diode D1 is grounded.

When the current flowing in the feedback resistor RF is small enough, that is, a voltage drop caused in the feedback resistor is small enough, the flowing relation may be obtained:

$$V_{out} = V_{d_1} + V_{BE}. \quad (2)$$

Thus, the diode $D_1$ is provided to set the output OUT in a substantial voltage level. The current source $I_{S2}$ is coupled with the emitter of the second transistor $Q_2$. The feedback resistor RF is connected between the base of the first transistor $Q_1$ and the emitter of the second transistor $Q_2$.

For controlling the bandwidth of the TIA 300, it may be considered to set another circuit such as a band limiting filter in the output terminal 62 or the collector of the first transistor $Q_1$, or to adjust the resistance of the feedback resistor RF. However, such an arrangement may degrade the signal quality processed by the TIA 300. For instance, additional filter may affect the group delay performance, in other words, the phase characteristics around the cutoff frequency, which may degrade the waveform of non-sinusoidal wave.

Next, some embodiments according to the present invention will be described.

First Embodiment

Figure 3:
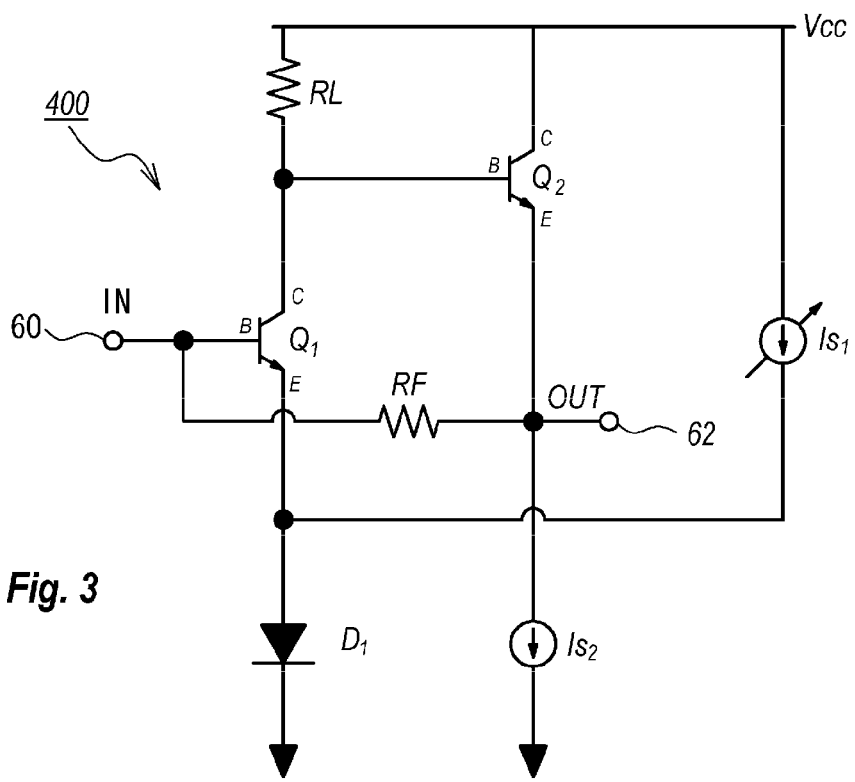
FIG. 3 is a circuit diagram of a TIA according to the first embodiment of the present invention.

FIG. 3 shows a circuit diagram of a TIA 400 according to the first embodiment of the present invention. Comparing with the conventional TIA 300 shown in FIG. 2, the TIA 400 has a feature that the TIA 400 includes another current source $I_{S1}$ coupled between the anode of the diode $D_1$ and the power supply Vcc to provide an additional current to the diode $D_1$.

The current source $I_{S1}$ may vary the forward current of the diode $D_1$. The current source $I_{S1}$ may be a variable current source where the output current thereof may be adjusted by, for instance, changing a reference voltage provided to the current source $I_{S1}$. Varying the forward current of the diode D1, the forward operating point thereof may be changed, which also changes the differential resistance of the diode $D_1$ at the operating point. Because the diode $D_1$ is connected to the emitter of the first transistor $Q_1$, that is, the diode D1 may operate as an emitter resistor of the transistor in the amplifying stage; the gain of the amplifying stage may be varied. That is, the bandwidth of the TIA 400 is varied by the relation shown in the first equation above described. For instance, increasing the output current of the current source $I_{S1}$, which decreases the emitter resistance for the first transistor $Q_1$ and increases the gain of the amplifying stage, thus, the bandwidth of the TIA 400 may be widen. On the other hand, decreasing the bias current of the diode $D_1$, which increases the emitter resistance; the gain of the amplifying stage decreases and the bandwidth of the TIA 400 may be narrowed.

The change of the differential resistance of the diode will be described as referring to FIG. 4 that shows a relation between the forward bias and the forward current of the diode. When the forward bias $V_1$ and $V_2$ are applied to the diode, the forward current $I_1$ and $I_2$ will flow therein. The differential resistance, $r_1$ and $r_2$, of the diode may be given by the slope, exactly the reverse of the slope, at respective operating points, $P_1$ and $P_2$. Accordingly, increasing the forward current from $I_1$ to $I_2$; the slope of the forward relation of the diode $D_1$ shown in FIG. 4 increases, which decreases the differential resistance r of diode. Oppositely, decreasing the forward current from $I_2$ to $I_1$, the slope of the V-I relation decreases but the differential resistance increases from $r_2$ to $r_1$.

Figure 4:
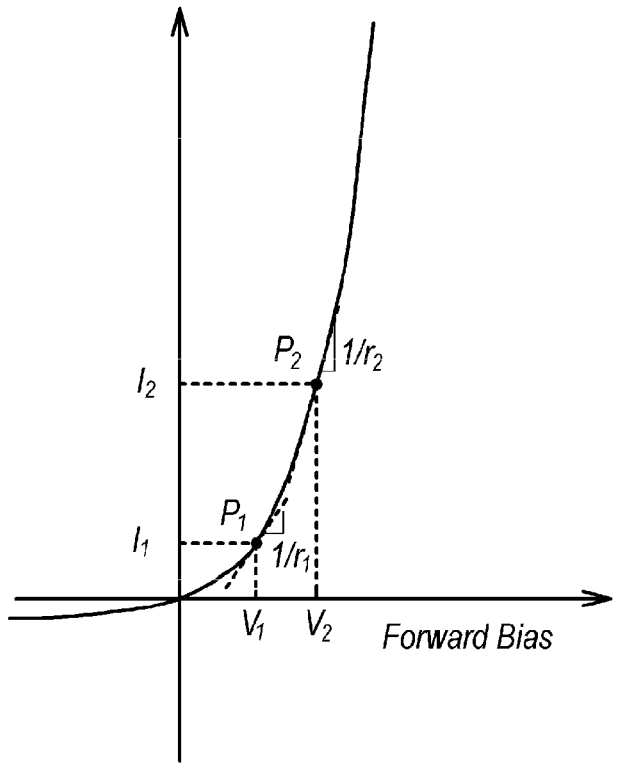
FIG. 4 shows the forward characteristic of a diode included in the TIA of the first embodiment of the invention.

As shown in FIG. 4, the bias voltage shows a smaller change compared with the change of the forward current. That is, the arrangement according to the present embodiment primarily changes the forward current of the diode as suppressing the variation of the bias voltage thereof, which may substantially set the operating point of the first transistor $Q_1$ in constant and the performance of the transistor Q1 may be kept constant. Thus, only the bandwidth of the TIA 400 may be varied by changing the gain thereof as suppressing the change occurred in the transfer characteristic.

Second Embodiment

Another TIA according to the second embodiment of the invention will be described as referring to FIG. 5. The TIA 500 of the present embodiment has the first current source Is1 shown in FIG. 3 replaced by the third transistor $Q_3$ and a resistor $R_1$. Providing a control signal $V_{ctrl}$ to the base of the third transistor $Q_3$, the emitter current of the transistor may be adjusted to change the forward current of the diode $D_1$. Thus, the gain, equivalently the bandwidth, of the TIA 500 may be adjusted without degrading the signal shape output therefrom.

FIG. 6 is a result of the bandwidth of the TIA 500. The horizontal axis corresponds to the control signal Vctrl provided to the base of the third transistor Q3, while, the vertical axis shows the bandwidth evaluated by the reduction of the gain by 3 dB, which is often called as the 3 dB bandwidth. As shown in FIG. 6, the control signal Vctrl may adjust the 3 dB bandwidth from about 17.5 GHz to 19 GHz in a range from 1 to 2.5V.

Third Embodiment

Figure 7:
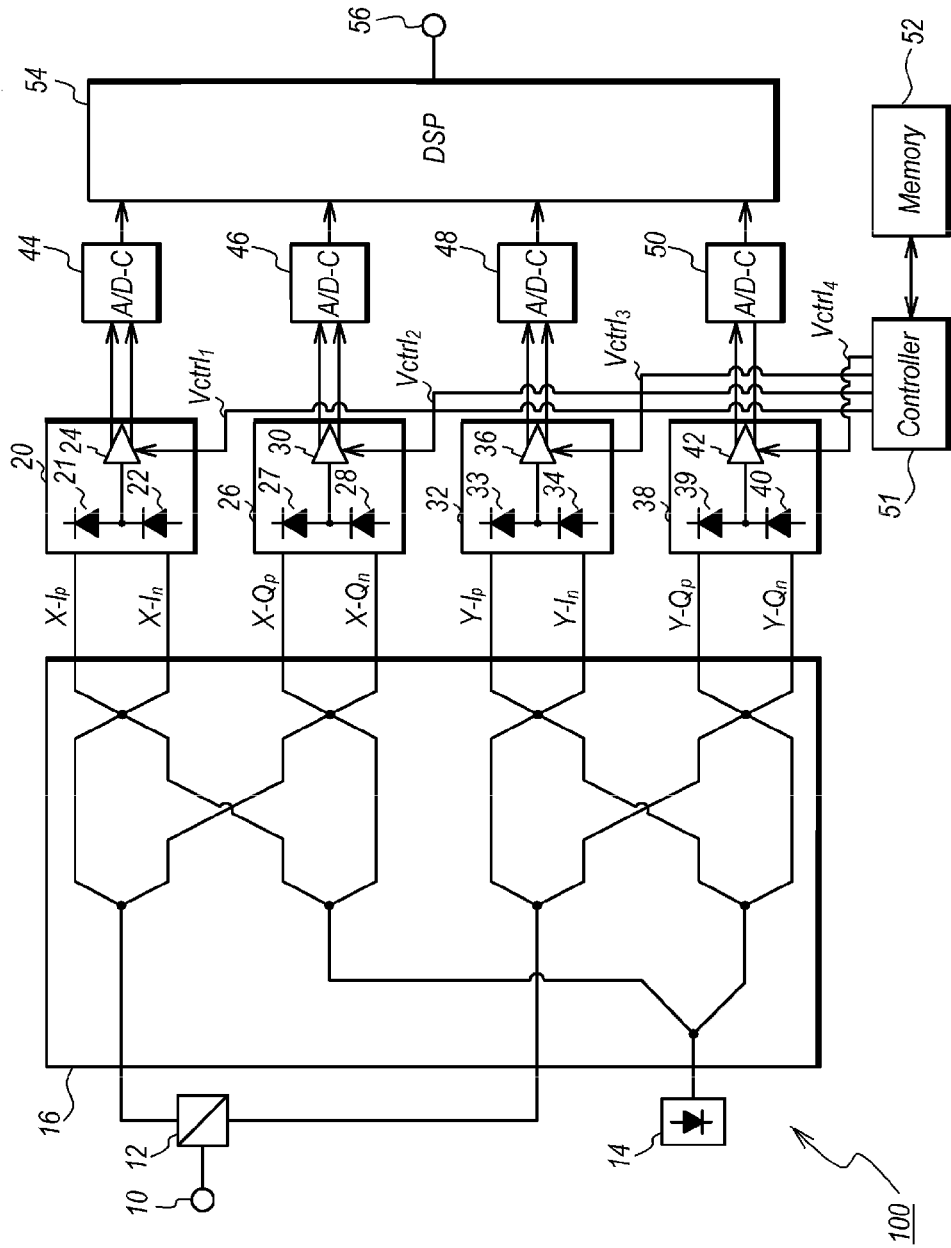
FIG. 7 is a block diagram of a digital coherent receiver implemented with the TIA of the first or second embodiment.

An optical receiver according to the third embodiment of the invention will be described as referring to FIG. 7. FIG. 7 is a block diagram of the optical receiver 100 primarily used in the digital coherent receiver, in particular, the optical receiver 100 is applicable for the dual polarization-quadrature phase shift keying (DP-QPSK) algorithm.

The optical receiver 100 includes an input terminal 10, a polarization beam splitter (PBS) 12, a local oscillator (LO) 14, an optical hybrid 16, a plurality of optical-to-electrical converters (O/E-C), 20, 26, 32, and 38, a plurality of analog-to-digital converters (A/D-C), 44 to 50, a digital signal processor (DSP) 54, a controller 51, a memory 52 and an output terminal 56. Each of O/E-Cs, 20, 26, 32, and 38, includes a pair of light receiving devices, 21 and 22, 27 and 28, 33 and 34, 39 and 40; and a TIA, 24, 30, 36, and 42. All TIAs, 24, 30, 36, and 42 may have the arrangement of the first or the second embodiment that provides a variable bandwidth controlled by the controller 51. Each of the O/E-Cs, 20, 26, 32, and 38, may further include a buffer amplifier in the downstream of the TIA, 24, 30, 36, and 42, which is not shown in FIG. 7. The buffer amplifier may convert the single phase output of the TIA, 24, 30, 36, and 42, to a pair of signals complementary to the others. The TIAs, 24, 30, 36, and 42, appeared in FIG. 7 collectively illustrate the buffer amplifier.

The signal light 10 coming in the input terminal 10 is divided by the PBS 12 to the X-polarization and the Y-polarization. The hybrid may mix these two polarized light beams with the local beam coming from the local oscillator LO 14 and deliver four light beams of two in-phase components I and two quadrature components Q. Subscriptions p and n appeared in FIG. 7 corresponds to the positive component and the negative component, respectively. For instance, X-Ip means the positive in-phase component of the X-polarization. The output beams each having a specific phase different from others enter the O/E-Cs, 20, 26, 32 and 38, are converted to electrical signals thereat, and guided to respective A/D-Cs 44-50. The A/D-Cs 44-50 convert the signals coming from O/E-Cs to the digital form and provides them to the DSP 54. The DSP carries out a complex process for four input signals and finally outputs the processed result in the output terminal 56. Thus, the digital coherent communication may transmit an optical signal that contains the phase information and the optical receiver 100 shown in FIG. 7 may receive such an optical signal and recover the phase information.

Because the components implemented within the coherent receiver 100, such as PDs, 21, 22, 27, 28, 33, 34, 39 and 40, and the TIAs, 24, 30, 36, and 42, inherently show the scattering in the performance thereof due to the instability during the production and the assembly, the outputs from the O/E-Cs, 20, 26, 32, and 38 scatters even when the hybrid 16 shows the intrinsic performance. The DSP 54 provided in the downstream of the optical receiver 100 may compensate this scattering by performing complex calculations; but the DSP would be forced to enhance the circuit size thereof. The coherent receiver 100 according to the present embodiment may compensate the scattered outputs of the PDs and the scattering of the TIAs by the arrangement of the TIA according to the first and second embodiments with the variable bandwidth.

The memory implemented with the receiver 100 may store values of the control signals, Vctrl$_1$ to Vctrl$_4$, which are tuned in advance to the practical application of the receiver 100. For instance, the bit-error-test of the TIAs, 24, 30, 36, and 42, may determine the value of respective control signals, Vctrl$_1$ to Vctrl$_4$. Specifically, an optical signal source provides an optical signal with a pseudo-random pattern and containing the phase information. Respective O/E-Cs, 20, 26, 32, and 38, receive thus prepared optical signal as varying the control signal, Vctrl$_1$ to Vctrl$_4$, and determines the value of the control signal such that the bit error rate of respective outputs becomes the minimum. Because the bit error rate depends on the bandwidth and the gain of the TIA, the condition of the control signal to make the bit error rate in minimum may adequately compensate the scattering in the performance of respective components. The controller 51 may read the value of the control signals, Vctrl$_1$ to Vctrl$_4$, out from the memory and set this value to respective TIAs, 24, 30, 36, and 42; thus, the transfer characteristic of respective O/E-Cs, 20, 26, 32, and 38, may be compensated. The TIA with the arrangement of the first or second embodiment may adjust the bandwidth thereof as keeping the phase characteristic substantially in constant. Accordingly, the TIA, 400 and 500, of the present invention may be adequately applicable to the digital coherent receiver 100 that is necessary to recover the phase information.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A trans-impedance amplifier including an input to receive an input current and an output to output an output voltage, comprising:
   a amplifying stage including a load resistor, a first transistor, and a diode which are connected in series between a power supply and a ground, said first transistor being connected in a control electrode thereof to said input;
   a emitter follower stage including a second transistor and a current source which are connected in series between said power supply and said ground, said emitter follower receiving output of said first transistor, said second transistor being connected in one of current electrodes thereof to said output;
   a trans-impedance connected between said input and said output to generate said output voltage by flowing said input current therein; and
   a variable current source to provide a bias current to said diode in said amplifying stage.

2. The trans-impedance amplifier of claim 1,
   wherein said other current source includes a third transistor and a resistor, said resistor being connected between said third transistor and said diode,
   wherein said bias current provided from said other current source is variable by a control signal applied to a control terminal of said third transistor.

3. The trans-impedance amplifier of claim 1,
   wherein said input current is provided from a photodiode connected to said input of said trans-impedance amplifier.

4. A trans-impedance amplifier for converting an input current to an output voltage, comprising:
   a first non-transistor including a base, an emitter and a collector, said base being connected to an input terminal of said trans-impedance amplifier;
   a load resistor connected between said collector of said first transistor and a power supply;
   a diode connected between said emitter of said first transistor and a ground;
   a second npn-transistor including a base, an emitter and a collector, said base being connected to said collector of said first npn-transistor, said collector being connected to said power supply, said emitter being connected to an output terminal of said trans-impedance amplifier;
   a current source connected between said emitter of said second transistor and said ground;
   a trans-impedance connected between said input terminal and said output terminal, said trans-impedance causing a voltage drop corresponding to said output voltage by flowing said input current therein; and
   another current source connected between said power supply and said emitter of said first npn-transistor,
   wherein said other current source provides a variable bias current to said diode.

5. The trans-impedance amplifier of claim 4,
   wherein said other current source including a third transistor and a resistor, said third transistor having two current electrodes and a control electrode, said resistor being connected between said emitter of said first transistor and one of said current electrodes of said third transistor, other of said current electrodes of said third transistor being connected to said power supply,
   wherein said variable bias current is variable by a control signal supplied to said control electrode of said third transistor.

6. An optical receiver, comprising:
   a plurality of optical-to-electrical converters each having a pair of photodiodes and a trans-impedance amplifier including an input terminal connected to said pair of photodiodes and an output terminal to output a voltage signal; and
   a controller, wherein each of said photodiodes connected in series and receives an optical signal complementary to each other, wherein said trans-impedance amplifier includes a first transistor, a second transistor, a diode, a current source, and a variable current source, said first transistor being connected in a control electrode thereof to said input terminal, said diode being connected between one of current electrodes of said first transistor and a ground, said second transistor being connected in a control electrode thereof to another current electrode of said first transistor, said current source being connected in one of current electrodes thereof to said current source and said output terminal, said trans-impedance being connected between said control electrode of said first transistor and said one of current electrodes of said second transistor, said variable current source being connected to said diode to provide a variable bias current to said diode, and wherein said controller controls said variable bias current in respective optical-to-electrical converters.

7. The optical receiver of claim 6, further includes an optical hybrid to generate said complementary optical signals each provided to said one of optical-to-electrical converters.

8. The optical receiver of claim 6, wherein each of said trans-impedance amplifier includes a buffer amplifier to convert said voltage signal into a pair of signals complementary to each others.

9. The optical receiver of claim 8, further comprising a plurality of analog-to-digital converters each receiving said complementary signals.

* * * * *